United States Patent
Eickelmann et al.

(10) Patent No.: US 9,972,733 B2
(45) Date of Patent: May 15, 2018

(54) MONOLITHIC INTERCONNECTION FOR SOLAR CELLS

(71) Applicant: International Business Machines Corporation, Armonk, NY (US)

(72) Inventors: Hans-Juergen Eickelmann, Nieder-Hilbersheim (DE); Ruediger Kellmann, Mainz (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/226,268

(22) Filed: Aug. 2, 2016

(65) Prior Publication Data

US 2018/0040753 A1 Feb. 8, 2018

(51) Int. Cl.
- *H02N 6/00* (2006.01)
- *H01L 31/042* (2014.01)
- *H01L 21/00* (2006.01)
- *H01L 31/0465* (2014.01)
- *H01L 31/18* (2006.01)

(52) U.S. Cl.
CPC ...... *H01L 31/0465* (2014.12); *H01L 31/1876* (2013.01)

(58) Field of Classification Search
CPC .......... H01L 31/046; H01L 31/0463; H01L 31/0465
See application file for complete search history.

(56) References Cited

U.S. PATENT DOCUMENTS

| | | | | |
|---|---|---|---|---|
| 2008/0105303 | A1* | 5/2008 | Oswald | B23K 26/03 |
| | | | | 136/261 |
| 2009/0194150 | A1* | 8/2009 | Aoki | H01L 31/0236 |
| | | | | 136/252 |
| 2012/0118369 | A1 | 5/2012 | Kedtke et al. | |
| 2015/0020863 | A1* | 1/2015 | Eickelmann | H01L 31/0508 |
| | | | | 136/244 |
| 2015/0024542 | A1 | 1/2015 | Eickelmann et al. | |
| 2015/0075581 | A1* | 3/2015 | Kim | H01L 31/0463 |
| | | | | 136/244 |

* cited by examiner

*Primary Examiner* — Eli Mekhlin
(74) *Attorney, Agent, or Firm* — Tihon Poltavets

(57) ABSTRACT

A method for fabricating a solar cell includes providing a first substrate with at least one protruding element on the first substrate. The method removes a portion of a lower conducting layer located on the first substrate, wherein the removed portion of the lower conducting layer is located near the at least one protruding element. The method removes a first portion of an active layer located on the lower conducting layer. The method deposits an upper conducting layer on the active layer, wherein the conducting layer covers the at least one protruding element. The method removes a portion of the upper conducting layer, wherein the removed portion of the upper conducting is located near the at least one protruding element.

6 Claims, 3 Drawing Sheets

MONOLITHIC INTERCONNECTION FOR SOLAR CELLS

BACKGROUND OF THE INVENTION

The present invention relates generally to the field of thin film cells that transduce electromagnetic radiation into electrical energy (herein generically called e/m radiation cells), more particularly to thin film solar cells.

Two known types of solar cells are: (i) thin film solar cells; and (ii) crystalline solar cells. Thin film solar cells are segmented into sub-cells in order to optimize cell performance in terms of voltage and current. The segments are reconnected again, preferably in a monolithic way (where the electrical connections are created in situ) without further added interconnection wiring. The segmentation is currently done by: (i) mechanical scribing; or (ii) laser evaporation (also called laser scribing). The conventional process for thin film solar cell segmentation includes the following scribe operations: (i) deposit and scribe into sub-cell formations the conducting back contact layer (also called the "lower conducting layer"); (ii) deposit and scribe into sub-cell formations the absorber (that is, the active layer); (iii) deposit and scribe into sub-cell formations the transparent conducting oxide (also called the "upper conducting layer"); and (iv) edge scribe. They are manufactured by large area deposition of thin films. For practical purposes, the module voltage has to be increased by a series connection of several sub-cells. In order to take advantage of monolithic integration, the scribing processes, mentioned in the previous paragraph, are used to mechanically separate, while maintaining electrical connections between, respective sub-cell areas from each other.

SUMMARY

Embodiments in accordance with the present invention provide a method for fabricating a solar cell, the method includes. The method of fabrication includes providing a first substrate with at least one protruding element on the first substrate; removing a portion of a lower conducting layer located on the first substrate, wherein the removed portion of the lower conducting layer is located near the at least one protruding element; removing a first portion of an active layer located on the lower conducting layer; depositing an upper conducting layer on the active layer, wherein the conducting layer covers the at least one protruding element; and removing a portion of the upper conducting layer, wherein the removed portion of the upper conducting layer is located near the at least one protruding element.

Embodiments in accordance with the present invention provide a solar cell assembly. The solar cell assembly includes a substrate, wherein the substrate includes at least one protruding element; a lower conducting layer; an active layer, wherein the active area surrounds the at least one protruding element; and an upper conducting area, wherein the upper conducting layer covers the at least one protruding element.

DETAILED DESCRIPTION

The present invention recognizes that the scribing processes conventionally used to make the sub-cell structures of thin film e/m radiation cells are not ideal, and can potentially reduce system performance through scribing-induced defects. The present invention further recognizes that: (i) conventional processes for making thin film solar cells are potentially detrimental to performance because they usually induce defect in the active semiconducting layers of the thin film solar cell; and (ii) the mechanical scribe step of the conventional process limits the spacing distance of scribes, resulting in a large dead area in between adjacent sub-cells of the thin film solar cell.

Figure 1:
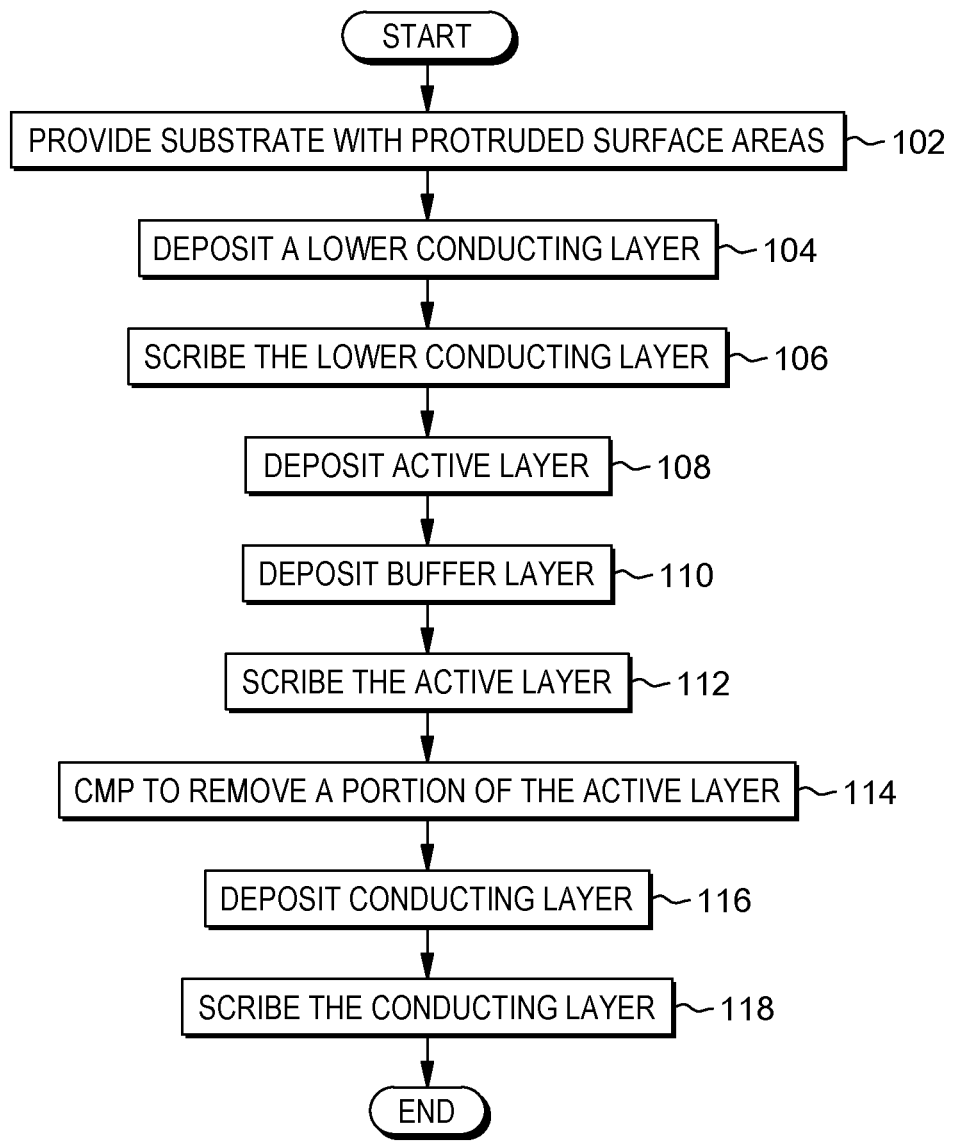
FIG. 1 is a flowchart depicting one embodiment of monolithic interconnection for thin film solar cells, in accordance with the present invention.

FIG. 1 is a flowchart depicting one embodiment of monolithic interconnection for thin film solar cells, in accordance with the present invention.

As shown in FIG. 1, processing begins at step 102 where a substrate (for example, glass substrate, polymeric substrate, steel with barrier layer) is provided as starting stock for the thin film solar cell. The starting stock substrate has protruding areas on its top surface area, near the scribing area. For example, the protruding surface areas may be in the shape of stripes corresponding to the location of planned divisions between the sub-cells of the final product. For glass substrates, the protrusions may be made by: (i) chemical etching; (ii) hot embossing; or (iii) a combination of (i) and (ii). For polymeric substrates, protrusions may be made by: (i) hot embossing; (ii) steel embossing; or (iii) a combination of (i) and (ii). The provide substrate is refabricated with the protruding areas along the sub-cells in a row separated, for example, by 1 millimeter and space from one and other by the width of the sub-cell segment, for example, 3 to 10 millimeters. The protruding areas (i.e., contacts) can either be metal or transparent conduction oxides or polymeric depending on a type of solar cell.

The protruding surface areas for point contacts protrude from the substrate, for example, by 1 to 5 micrometers and can include, for example, of 1 to 100 micrometer diameter. A measurement for the diameter of the protruding surface is selected to allow for sufficient conductance and limited resistance to typical currents (e.g., 10 to 30 mA/cm$^2$). Resistance attributed to contact is minimized since only one interface between the front contact and the back contact of the thin film solar cell is present.

Processing proceeds to step 104 where a deposition device deposits a lower conducting layer on the top surface of the substrate, including over the protruding areas mentioned above in connection with step 102. The lower conducting layer (i.e., back contact) may be any material suitable for a lower conducting layer in a thin film e/m radiation cell, now conventional or to be developed in the future. In some embodiments, it may be preferable to use a material that is resistant to chemical mechanical polishing—CMP (or at least some types of CMP) so that CMP material removal of the active layer does not impact the geometry of the lower conducting layer. The conducting layer may be made of any metal capable of forming a good ohmic contact to the active layer (for example, Ag, Al or Mo).

Processing proceeds to step 106 where a scribing device (not shown in the Figures) scribes the lower conducting layer in order to separate the lower conducting layer into sub-cell structures. This step may be accomplished by any appropriate type of scribing now known or to be developed in the future. Alternatively, other material removal processes could be used to break the lower conducting layer into multiple sub-cell structures. The scribing device removes the lower conducting layer near the protruding areas (i.e., contacts) of the substrate, where by removing the lower conducting layer near the protruding areas allows for the lower conducting layer to remain on the protruding areas of the substrate. Alternatively, the scribing device removes the lower conducting layer adjacent to a bottom edge of the protruding areas of the substrate.

Processing proceeds to step 108 where a deposition device (not shown in the Figures) deposits an absorber layer (also sometimes referred to as an active layer).

Processing proceeds to step 110 where a deposition device (not shown in the Figures) deposits a buffer layer on top of the remaining portion of the active layer.

Processing proceeds to step 112 where a scribing device (not shown in the Figures) scribes the active layer (i.e., absorber layer) in order to separate the absorber layer into sub-cell structures. This step may be accomplished by any appropriate type of scribing now known or to be developed in the future. Alternatively, other material removal processes could be used to break the absorber layer into multiple sub-cell structures.

Processing proceeds to step 114 where a CMP device (not shown in the Figures) performs CMP on the top surface of intermediate state solar cell. This CMP removes part, but not all, of active layer in a top downwards manner. More specifically, the CMP removes a portion of the active layer from the initial top surface down to the level of its lower surface where the discontinuity caused by protrusion is located. Because the CMP removes material all the way down to the lower surface in the vicinity of the discontinuity in the lower surface, this means that the active surface is completely gone over the topmost portion of protrusion. Additionally, in areas where the lower surface of the active layer is flat and planar, there is still plenty of active layer remaining over these portions, despite the material removal accomplished by the CMP. These remaining portions of active layer become sub-cells, but the completely removed portions of active layer are now breaks between sub-cells that electrically isolate the sub-cells from each other. It is the discontinuity in the lower surface of the active layer that causes these "breaks" in the active layer to occur. In another embodiment, laser planarization removes the active layer above the protruding areas through laser desorption.

Any type of CMP, now known, or to be developed in the future, may be used. In at least some embodiments of the present invention, the CMP of step 114 does not adversely affect the radiation-to-electricity transduction functionality of the remaining portion of active layer, which is advantageous from the perspective of solar cell performance. Alternatively, the material removal of step 114 can be accomplished by pure mechanical polishing, as an alternative to CMP. The CMP of step 114 has to be selective by not removing the bottom conductive layer, while reliably removing the active layer material. The chemical agent for the CMP of step 114 contains a mixture of acidic oxidizing and stabilizing agents.

Processing proceeds to step 116 where a deposition device (not shown in the Figures) deposits a transparent conducting layer (also called an upper conducting layer or front contact) on top of the remaining portion of the buffer layer deposited at step 110. The upper conducting layer (see definition of "layer," below, in the definitions sub-section) includes a buffer sub-layer and a transparent front contact layer.

The upper conducting layer, or its constituent sub-layers, may be any materials suitable for a lower conducting layer in a thin film e/m radiation cell, now conventional or to be developed in the future. In order to be suitable for use as an upper conducting layer, the material and/or thickness of the upper conducting layer must be chosen so that the upper conducting layer is at least somewhat transmissive with respect to the wavelengths of e/m radiation that the active layer is designed to transduce into electricity. In some embodiments, it may be preferable to use a material for the upper conducting layer that can be easily removed by CMP (or at least some types of CMP) so that a CMP process can be used to divide the upper conducting layer into sub-cell structures. However, it should be understood that CMP is not utilized to divide the upper conducting layer into sub-cell structures. In this embodiment, the upper conducting layer is made of a doped transparent conducting oxide such as indium tin oxide (ITO), or aluminum doped zinc oxide (ZnO:Al).

Processing proceeds to step 118 where a scribing device (not shown in the Figures) scribes the upper conducting layer in order to separate the upper conducting layer into sub-cell structures. This step may be accomplished by any appropriate type of scribing now known or to be developed in the future. Alternatively, other material removal processes could be used to break the upper conducting layer into multiple sub-cell structures. The scribing device removes the upper conducting layer near the peaks of the protruding areas (i.e., contacts) of the substrate, where by removing the upper conducting layer near the protruding areas allows for the upper conducting layer to remain on the peaks of the protruding areas of the substrate and in contact with the lower conducting area covering the protruding areas. In another embodiment, the scribing device removes the upper conducting layer such that a portion of the scribed upper conducting layer is in parallel and aligned with the scribed lower conducting layer.

Figure 2:
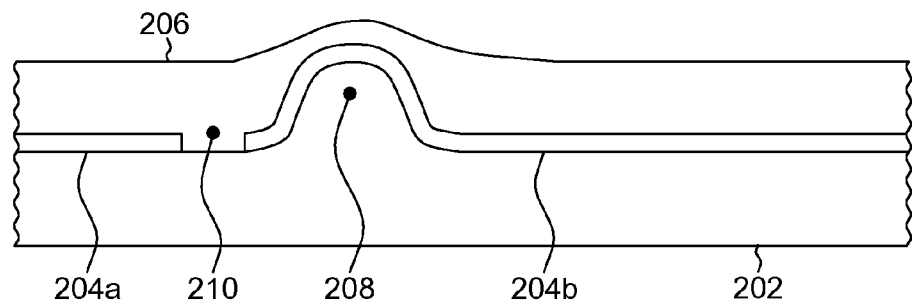
FIG. 2 depicts a cross-sectional view of a solar cell in an intermediate sub-assembly state, in accordance with the present invention.

FIG. 2 depicts a cross-sectional view of a solar cell in an intermediate sub-assembly state, in accordance with the present invention. The intermediate sub-assembly state occurs just after step 108, where a deposition device deposits an absorber layer. The intermediate state solar cell includes: substrate 202 (including protruding area 208); first sub-cell portion 204a of lower conducting layer 204; second sub-cell portion 204b of conducting layer 204; active layer 206; and first scribed gap 210 in the lower conducting layer. Protruding area 208 was discussed above in connection with step 102. The scribing discussed above, in connection with step 106 forms first scribed gap 210. Note that protruding area 208 causes a discontinuity in the lower surface of active layer 206. More specifically, the lower surface of active layer is generally flat and planar, except the portion of the active layer that is over protrusion, which is a discontinuity in the shape of a recess in the lower surface of the active layer.

Figure 3:
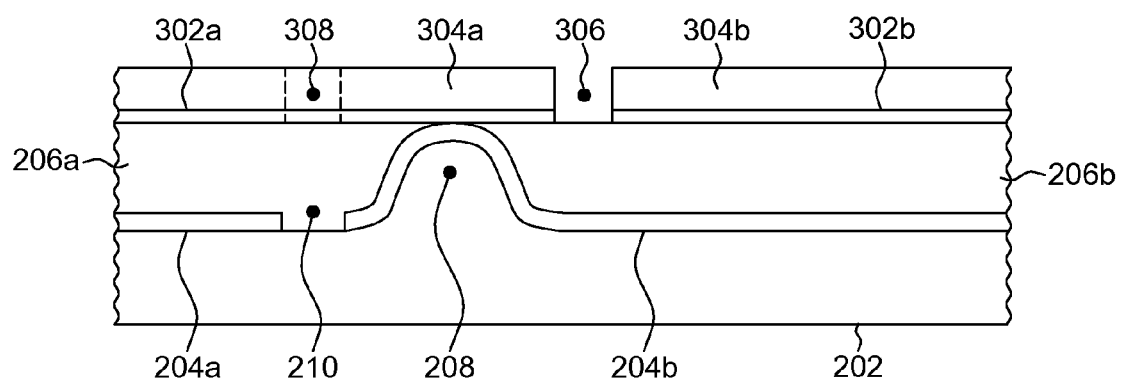
FIG. 3 depicts a cross-sectional view of a solar cell in a final assembly state, in accordance with the present invention.

FIG. 3 depicts a cross-sectional view of a solar cell in a final assembly state, in accordance with the present invention. The final assembly state occurs just after step 118, where a scribing device scribes the upper conducting layer in order to separate the upper conducting layer into sub-cell structures. The final assembly state solar cell includes: substrate 202 (including protruding area 208); first sub-cell portion 204a of lower conducting layer 204; second sub-cell portion 204b of conducting layer 204; first scribed gap 210; first sub-cell portion 206a of active layer 206; second sub-cell portion 206b of active layer 206; second scribed gap 306; continued second scribed gap 308; first sub-cell portion 302a of buffer sub-layer 302; second sub-cell portion 302b of buffer sub-layer 302; first sub-cell portion 304a of transparent contact sub-layer 304; second sub-cell portion 304b of transparent contact sub-layer 304. Taken together, sub-layers 302 and 304 make up the upper conducting layer.

As shown by comparing FIGS. 2 and 3, it can be seen that because of the CMP of step 114, the height of layer 206 was reduced down to the height of protruding surface area 208. However, protruding surface area 208 and the portion of layer 204 extending over the protruding surface area is not substantially affected by the CMP of step 114.

As shown in FIG. 3, the scribing of step 118 causes second scribed gap 306 and continued second scribed gap 308 in upper conducting layer 302 and 304, which divides sub-layers 302 and 304 into sub-cell structures 302a, 302b, 304a and 304b. In this embodiment, second scribed gap 306 and continued second scribed gap 308 exposes a part of layer 204b to separate the sub-cells. In this embodiment, the upper conducting layer of the first sub-cell 304a contacts the lower conducting layer of the second sub-cell 204b to provide the monolithic series connection of the sub-cells to achieve a higher module voltage. Alternatively, in other embodiments, the sub-cells could be completely electrically isolated from each other.

Figure 4:
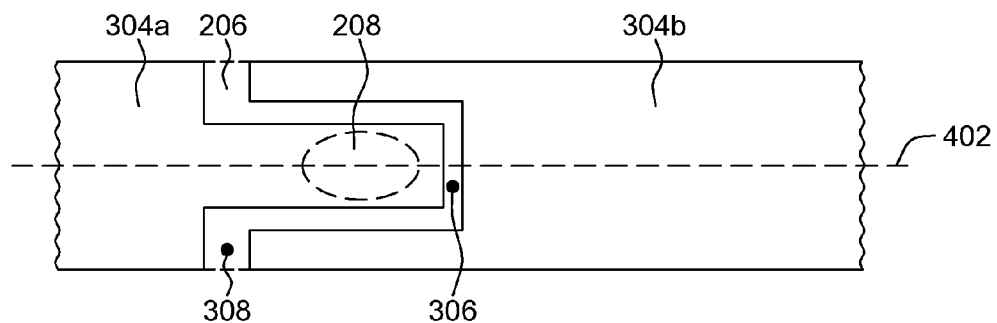
FIG. 4 depicts a top view of a solar cell in a final assembly state, in accordance with the present invention.

FIG. 4 depicts a top view of a solar cell in a final assembly state, in accordance with the present invention. The top view of the final assembly state solar cell illustrates the visible: active layer 206; second scribed gap 306; continued second scribed gap 308; first sub-cell portion 304a of transparent contact sub-layer 304; second sub-cell portion 304b of transparent contact sub-layer 304. The top view of the final assembly state solar cell also illustrates the location of protruding area 208 on substrate 302 below first sub-cell portion 304a of transparent contact sub-layer 304 and first sub-cell portion 302a of buffer sub-layer 302. Plane 402 represents a horizontal plane from which the cross-sectional views of a solar cell in FIG. 2 and FIG. 3 are viewed.

Figure 5:
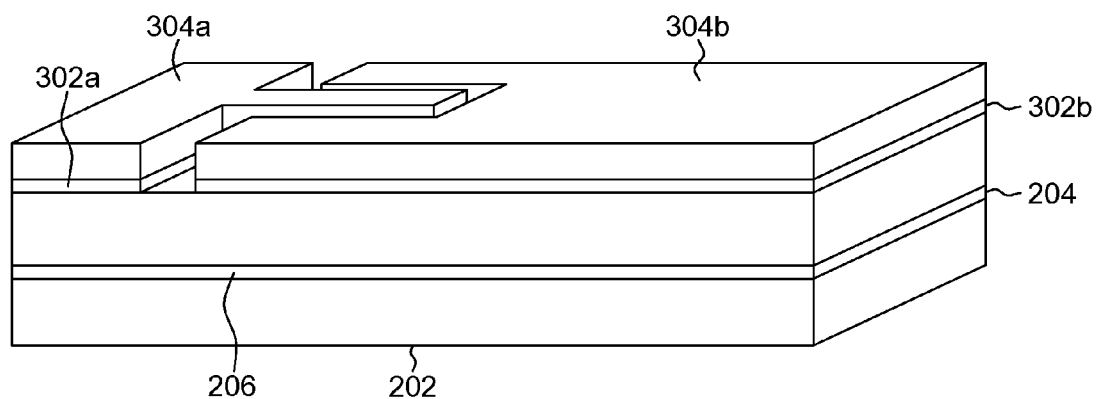
FIG. 5 depicts a three dimensional view of a solar cell in a final assembly state, in accordance with the present invention.

FIG. 5 depicts a three dimensional view of a solar cell in a final assembly state, in accordance with the present invention. The three dimensional view of the final assembly state solar cell illustrates the visible: substrate 202; lower conducting layer 204; active layer 206; first sub-cell portion 302a of buffer sub-layer 302; second sub-cell portion 302b of buffer sub-layer 302; first sub-cell portion 304a of transparent contact sub-layer 304; second sub-cell portion 304b of transparent contact sub-layer 304.

According to some embodiments of the present invention a process for making e/m radiation cells (for example, solar cells) includes one or more of the following: (i) use of a substrate with protruded areas; and/or (ii) replacing at least a portion of the scribing operations (for example, the P2 scribe of the absorber) by chemical mechanical polishing (CMP) operation(s). A method for segmenting thin film solar cells will now be discussed. Thin film solar cells usually require segmentation into sub-cells in order to optimize cell performance in terms of voltage and current. The segments are electrically reconnected again, usually in a monolithic way without further added interconnection wiring. A method embodiment of the present invention includes the following operations: (i) provide a substrate; (ii) scribe the conducting back contact layer (also referred to as the P1 scribe); (iii) perform absorber-related CMP; (iv) scribe the transparent conducting oxide (also referred to as the P3 scribe); and (v) edge scribe (also referred to as the P4 scribe). Some embodiments of this process: (i) reduce or eliminate defects in the active semiconducting layers; and (ii) reduce or eliminate the dead area in between sub-cells. Some embodiments of the present invention target CIGS (copper indium gallium selenide) solar cells, but other embodiments are more broadly directed to: (i) any thin film solar cells that has sub-cells; and/or (ii) any thin film e/m radiation cell that has sub-cells.

As mentioned above, some embodiments of this disclosure apply chemical mechanical polishing methods in order to separate sub-cells. In these embodiments, layers are: (i) deposited onto dimples (that is protrusions made by making dimples in the substrate); or, alternatively or additionally, (ii) a flat substrate is modified by small humps (or protrusions). In these embodiments, an e/m-voltaic (such as a photovoltaic layer) active layer (also called the thin film) is deposited in and/or on both: (i) the protrusions, and (ii) the flat portion of the substrate. Active layer material above the protrusions is removed by chemical mechanical polishing. This removal of the protruded areas leaves separate segments of thin film material as deposited photovoltaic material such that the thin film is divided into sub-cell structures. Some embodiments of the present invention provide a new method, employing chemical mechanical polishing to separate sub-cells reducing the defects generated by scribing. The present invention recognizes that there is a need to improve the current scribing process for thin film solar cells, especially for CIGS (copper indium gallium selenide) active layer, CZTS (copper zinc tin sulfide) active layer, or CdTe (cadmium telluride) active layer solar cells.

Thin film solar cells are photovoltaic devices manufactured by deposition of a thin film of the absorber material onto large substrates, for example glass plates the size of window panes. After deposition of the absorber and the formation of a suitable photovoltaic junction, the film would appear as a single diode with a voltage related to the internal bandgap of the semiconducting material and the electrical properties of the network, much like a silicon wafer with added contact grid but with larger dimensions. In this case the voltage would be a fraction of a volt. If the module is able to deliver a power in the range of 60 to 100 watts, then relatively large currents result. In many applications, a higher voltage and lower current is beneficial, because this reduces ohmic losses in series resistance. The transparent conducting oxide (TCO) which is used as a front window contact material is far from being ideal as a conductor. For this reason, the large absorber is cut into segments and the segments are interconnected again. This interconnection is done via soldered stripes for silicon wafers but needs to be done in a different way for thin film solar cells. Fortunately, a monolithic approach is possible, segmenting the different films and interconnecting them again via deposition of thin films. In that case, no wiring or soldering is required for thin film solar cells. Moreover, no contact grid deposition is required.

An embodiment of the present invention is as follows: (i) provide substrate with protruded surface areas, for example in stripes; (ii) deposit backside contacting layer; (iii) scribe backside contacting layer; (iv) deposit absorber; (v) chemical mechanical polishing of the surface and recess to level of protrusion, exposing the backside conducting layer; (vi) deposit frontside transparent conducting layer; (vii) scribe front side transparent conducting layer; and (viii) module fabrication. The method is quite general and not limited to a particular material system and can be applied to any thin film semiconducting thin film for singulation and series connection. The CMP scribing method can also be applied for roll-to-roll manufacturing of thin film solar cells and also on polymeric/metal sheet substrates.

Some embodiments of the present invention may have one, or more, of the following features, characteristics and/or advantages: (i) increases the module efficiency relative to panels that exclusively use scribing to separate sub-cells; (ii) prevent damage to the absorber layer; and/or (iii) separate the absorber without damaging the material by inducing defects or changing its phase state through heating, etc.

In some embodiments of the present invention, in order to apply CMP to thin film solar cells for separation into sub-cells, substrate topography is modified. This modification can be achieved by etching or deposition methods. In one embodiment, the active layer(s) are deposited into dimples in the substrate. In another embodiment, a flat substrate is modified by deposition of small humps, creating a similar shaped surface topography. In either type of embodiment, the active layer(s) cover substantially the entire substrate, including its flat, planar areas and also its dimples (that is, a protrusion made by dimpling)/humps (collectively called protrusions). The protruded areas are then removed by chemical mechanical polishing. This leaves separate flat, planar, mutually isolated sub-sell segments of the active layer(s).

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: non-exclusive or; for example, A and/or B means that: (i) A is true and B is false; or (ii) A is false and B is true; or (iii) A and B are both true.

Electrically Connected: means either directly electrically connected, or indirectly electrically connected, such that intervening elements are present; in an indirect electrical connection, the intervening elements may include inductors and/or transformers.

Mechanically connected: Includes both direct mechanical connections, and indirect mechanical connections made through intermediate components; includes rigid mechanical connections as well as mechanical connection that allows for relative motion between the mechanically connected components; includes, but is not limited, to welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

Over: if thing A is "over" thing B, then this should not be taken to necessarily imply that thing A and thing B are in contact.

Layer: a single layer or a set of consecutive layers that acts as a single layer; for example, an active layer may be a single layer, or a set of discrete and consecutive layers that transduce electromagnetic radiation into electricity; as another example, a conductive layer may include multiple discrete layers, but still herein be referred to as a singular "layer."

Polishing: CMP and/or pure mechanical polishing.

What is claimed is:

1. A method for fabricating a solar cell, the method comprising:
    providing a first substrate with at least one element on the first substrate, wherein the at least one element protrudes 1 to 5 micrometers on a top surface of the first substrate;
    depositing a lower conducting layer on the first substrate;
    removing a portion of the lower conducting layer located on the first substrate, wherein the removed portion of the lower conducting layer is located along a first side of the at least one element;
    depositing an active layer on the lower conducting layer;
    removing a portion of the active layer located on the lower conducting layer;
    depositing an upper conducting layer on the active layer, wherein the upper conducting layer covers the at least one element; and
    removing a portion of the upper conducting layer, wherein the removed portion of the upper conducting layer includes a first removed portion that partially surrounds the at least one element, a second removed portion that connects to a first end of the first removed portion, a third removed portion that connects to a second end of the first removed portion, wherein the second removed portion and the third removed portion each align with the removed portion of the lower conducting layer.

2. The method of claim 1, wherein removing a portion of the lower conducting layer located on the first substrate, comprises:
    scribing the portion of the lower conducting layer, wherein scribing the portion of the lower conducting layer exposes the substrate.

3. The method of claim 1, further comprising:
    subsequent to depositing the active layer on the lower conducting layer, depositing a buffer layer on the active layer.

4. The method of claim 3, wherein removing a portion of the active layer located on the lower conducting layer, comprises:
    scribing the first portion of the buffer layer and the active layer, wherein scribing the first portion of the active layer exposes the lower conducting layer.

5. The method of claim 1, wherein removing a portion of the upper conducting layer, comprises:
    scribing the portion of the upper conducting layer, wherein scribing the portion of the upper conducting layer exposes the active layer.

6. The method of claim 1, wherein the active layer is photovoltaic.

* * * * *